United States Patent [19]
Friedel

[11] 4,233,392
[45] Nov. 11, 1980

[54] LIGHT-SENSITIVE MATERIAL FOR TANNING DEVELOPMENT COMPRISING PRETREATED CARBON

[75] Inventor: Horst Friedel, Neu Isenburg, Fed. Rep. of Germany

[73] Assignee: E. I. Du Pont de Nemours and Company, Wilmington, Del.

[21] Appl. No.: 31,977

[22] Filed: Apr. 20, 1979

[30] Foreign Application Priority Data

Jul. 25, 1978 [DE] Fed. Rep. of Germany ....... 2832530

[51] Int. Cl.[2] ........................... G03F 7/02; G03C 1/40
[52] U.S. Cl. .................................... 430/264; 430/510; 430/631; 430/325; 252/444
[58] Field of Search ............................ 96/33; 252/444; 423/660; 430/510, 264, 631, 325

[56] References Cited

U.S. PATENT DOCUMENTS

| | | | |
|---|---|---|---|
| 1,782,493 | 11/1930 | Van Loon | 252/444 |
| 2,596,756 | 5/1952 | Yutzy et al. | 96/36.3 |

FOREIGN PATENT DOCUMENTS

| | | | |
|---|---|---|---|
| 292213 | 6/1928 | United Kingdom | 252/444 |
| 1294355 | 10/1972 | United Kingdom | 96/29 R |

*Primary Examiner*—Edward C. Kimlin
*Assistant Examiner*—Alfonso T. Suro Picó

[57] ABSTRACT

In a light-sensitive material for tanning development containing unhardened or only slightly hardened gelatin silver halide emulsion layers, the silver content required to obtain maximum density is reduced by incorporating carbon black pretreated with water-miscible compounds which have a higher affinity for carbon black than gelatin. Suitable treatment may be provided by at least two of the following: poly-n-vinyl lactams, polyalkylene oxide derivatives, water-miscible compounds containing at least two OH groups, and polyalkylene oxides with a molecular weight of at least 400.

12 Claims, No Drawings

LIGHT-SENSITIVE MATERIAL FOR TANNING DEVELOPMENT COMPRISING PRETREATED CARBON

TECHNICAL FIELD

The subject of the present invention is a light-sensitive material for the production of images through tanning development.

BACKGROUND ART

It is generally known that exposed photographic materials which contain a gelatin/silver halide layer which is slightly hardened or unhardened can be hardened imagewise by development using tanning developing substances. The oxidation products of the tanning developer formed in the exposed areas of the image have the property of hardening gelatin. On the other hand, in the unexposed areas of the image where there is no development, this hardening does not occur. These areas of the image, therefore, can be washed off with warm water or can be transferred wholly or partially onto an image-receiving material.

It is known from U.S. Pat. No. 2,596,756 "Photomechanical Copy Method" to add pigments, especially carbon black, to the light-sensitive layers of these materials to bestow upon the transferred image parts a sufficient optical density.

A wash-off material is known from U.S. Pat. No. 3,364,024, "Photographic Process" where a silver halide emulsion layer and a carbon black-containing gelatin layer which is free of silver halide is arranged on the same side of the emulsion support. This layer containing carbon black is likewise imagewise hardened during development and contributes to the formation of the necessary optical density, thereby reducing the amount of silver halide needed to produce an image. The possibility of saving silver is of considerable significance in view of high silver prices. However, these carbon black-containing materials have considerable disadvantages which result from a reciprocal effect or action between carbon black and gelatin. Carbon black brings about an undesirable hardening of the gelatin contained in the emulsion layer on the emulsion support side and thus after a short holding time this leads to a hardening of the total layer. This undesirable hardening leads to the result that, after exposure and development, it is not possible to make a sufficient differentiation between the hardened and nonhardened areas of the image. Because this disadvantageous effect of carbon black is proportional to its concentration in the layer there is naturally a limitation to the amount of carbon black which can be incorporated in these layers and, thus, the possibility of reducing the silver halide amount required to attain a certain optical density.

In order to be able to use higher carbon black concentrations in the layers, it has already been suggested to use layers with a high content of gelatin or to introduce the carbon black in a separate layer and, as known from British Pat. No. 1,294,355, additionally to provide a separating layer between the emulsion support and the light-sensitive layer. Aside from the fact that the problem of poor storability cannot satisfactorily be solved by these measures, the resolving power of such materials is so poor because of the high layer density or the intermediate layers that they are unusable for many applications.

The object of the present invention, therefore, is to provide a light-sensitive, carbon black-containing material for tanning development which has an excellent storability and high resolving power.

SUMMARY OF THE INVENTION

This object is achieved, according to the present invention, by providing a light-sensitive material for tanning development consisting of an emulsion support, an unhardened or only slightly hardened gelatin-containing silver halide emulsion layer and, if desired, an auxiliary layer, wherein at least one layer contains a carbon black which participates in the formulation of an image and is characterized in that this carbon black was pretreated with water-miscible compounds which have a higher affinity for carbon black than gelatin.

DETAILED DESCRIPTION OF THE INVENTION

The pretreatment of carbon black according to the invention can be accomplished by employing at least two compounds selected from at least two of the following compound classes:

(a) Poly-N-vinyl lactams (b) Polyalkylene oxide derivatives (c) Low volatility water-miscible compounds containing at least 2 OH groups (d) Polyalkylene oxides with a molecular weight of at least 400.

Poly-N-vinyl lactams suitable for the pretreatment of carbon black are polyvinyl pyrrolidone, polyvinyl piperidone, polyvinyl caprolactam and polyvinyl succinimide.

Polyalkylene oxide derivatives useful in the invention are primarily esters and ethers. Individually named, they are:

Polyethylene oxide-stearyl ether, polyethylene oxide-lauryl ether, polyethylene oxide-stearic acid ester, octyl phenoxy polyethyleneoxyethanol, polyethylene glycol-distearate, polyethylene glycol monolauric acid ester, and polyethylene oxide-sorbitan lauric acid ester.

Suitable low volatility water-miscible compounds containing at least 2 OH groups are: pentane diols such as methyl pentane diol, hexane diols, octane diols, trimethylol propane, glycerin, sorbitol, mannitol, ethylene glycol and propylene glycol.

Moreover, within the sense of the present invention, polyalkylene oxides with a molecular weight of at least 400 are useful. Practically all known carbon black types are considered suitable as pigments. Of special significance herein are furnace blacks and channel blacks. The particle size of the carbon black should lie between 20 and 50 mμ, and the surfaces between 50 and 180 $m^2/g$. The volatile ingredients should be less than 6%.

To carry out the pretreatment, the two compounds required according to the invention are made available in an aqueous solution. The carbon black is then added and, subsequently, is dispersed using a high speed stirrer (10,000 rpm) or a ball or pearl mill, until no carbon black agglomerates are further visible upon testing with a microscope. The two compounds are preferably used in such an amount that their total quantity equals at least 50% of the carbon black to be treated.

To produce the light-sensitive wash-off material, the pretreated carbon black is added to the silver halide emulsion and/or to a gelatin-containing auxiliary layer and is homogenized by stirring or by means of a mixing device. Admixture preferably will take place immediately before casting. All known emulsions containing silver chloride, silver bromide and silver iodide or mixtures of these silver salts are considered as useful silver halide emulsions.

Based on the excellent compatibility of the pretreated carbon black opposite gelatins, the layers can contain high concentrations of carbon black which may amount up to 150 g per 1 mole silver halide without the appearance of disadvantageous effects. It is thereby possible to considerably reduce the silver halide amount necessary to produce the desired image density. It has been shown that amounts from 0.005 to 0.01 mole silver halide/$m^2$ completely suffice to attain image densities of 3 and more. According to an especially preferred embodiment, the pretreated carbon black is added to the light-sensitive layer itself. In this case, the additional auxiliary layers may be dispensed with so that a wash-off material can be produced which corresponds to highly sensitive graphic films in regard to its thickness and resolving power.

Gelatin is the preferred binder for the production of silver halide emulsion layers. The gelatin, however, can be partially replaced by other natural or synthetic water-permeable, organic, colloidal binders. Such substances are: water-permeable or water-soluble polyvinyl alcohols and their derivatives, e.g., partially hydrolyzed polyvinyl acetates, polyvinyl ethers, and acetals which contain a large number of $—CH_2CHOH$ groups lying outside the linking chain. Additional substances are: hydrolyzed intermediate polymers of vinyl acetate and addition polymerized compounds, of maleic anhydride, of acrylic acid and methacrylic acid ethyl ester, as well as styrene. The useful polyvinyl acetals include polyvinylacetaldehydeacetal, polyvinylbutyraldehydeacetal, and polyvinyl sodium-o-sulfobenzaldehydeacetal. Further useful colloidal binders are poly-N-vinyl lactams, hydrophilic mixed polymers of N-acrylamidoalkylbetaine, and hydrophilic cellulose ethers and esters.

Also a mixture of gelatin with a polymer dispersion of polyacrylate or mixed polymers of vinyl chloride-alkyl acrylate may be especially suitable. Transparent or opaque materials known for this purpose are considered as supports for the light-sensitive layer. Mentioned are, by way of example, papers, if desired, provided with Baryta; paperboard, metal foils, e.g., of aluminum, copper steel, etc.; wood, glass, foils or fiber fleeces of natural or synthetic polymers as, e.g., polyamides, rubber, polyethylene or -propylene; linear polyesters, e.g., polyethylene terephthalate, cellulose, cellulose esters, polyvinyl chloride or its mixed polymers, polyacrylonitrile, etc.

Many tanning developing agents suitable for forming the image are described in the literature. In this connection are mentioned the polyoxy compounds of benzene, naphathalene or diphenyls, which can be substituted by halogen or alkyl and/or aryl groups in the nucleus. Polyhydroxy-spiro-bis-indane compounds described in U.S. Pat. No. 3,440,049 "Polyhydroxy-Spiro-Bis-Indene Photographic Tanning Agent" have proven to be also especially valuable within the framework of the present invention.

The tanning developer agents can be added to the light-sensitive material itself, but may however, also be present in treatment baths.

According to an especially preferred embodiment, the wash-off material contains the tanning developer agent in a protective layer placed above the light-sensitive silver halide layer while the pretreated pigment is present in the light-sensitive layer itself.

To produce the image, the photographic material is exposed behind an original, is developed in the presence of a tanning developer and is subsequently pictorially washed off. All known tanning developer solutions which in addition to the tanning developer material contain an alkali and/or an alkali mixture as the essential ingredient are suited. The baths and/or layers, naturally, can contain other known ingredients such as e.g., wetting agents, sequestering compounds, oxidation-preventive agents, and the like. If the developer material is contained in the photographic layer itself, then development takes place in an alkali activating bath. Suitable alkalis for the preparation of such activator solutions are alkali carbonates and alkali hydroxides as well as known carbonate and phosphate buffer systems. The pH value of the baths should be at least 9. The washing off of the nonhardened image parts preferably takes place by spraying warm water having a temperature of at least 30° C.

Photographic wash-off materials which contain carbon black pretreated according to the invention demonstrate a series of advantages over the prior art. Thus, it is possible to produce layers which have excellent storability. As a result of the compatibility of the pretreated carbon black in the presence of gelatin, the layers can contain such high concentrations of carbon black that the total image formation can essentially be of carbon black. It is thereby possible to save considerable amounts of silver. Moreover, it is not necessary to raise the binder content of the layers or to provide special auxiliary layers between the emulsion support and the light-sensitive emulsion, so that very thin layers of wash-off materials with a high resolving power can be produced.

Based on its thin layers and its high resolving power, such wash-off materials are not limited to conventional applications such as the reproduction of drawings and outlines, but they can also be used in place of conventional films for the reproduction of fine line originals and halftone originals with high rulings for contact and camera work.

It was an unanticipated and surprising result that such advantageous effects could be achieved with the pretreated carbon black of the invention. If, instead, an untreated carbon black is added to an emulsion containing the components used for the pretreatment of the carbon black, then the effect of the invention does not take place. This is more fully illustrated in the following examples which serve to illustrate the invention.

EXAMPLE 1

To an unhardened gelatin silver chloride emulsion which contained 85 g gelatin per mole of silver chloride were added immediately before coating 100 g furnace black per mole of silver chloride; the furnace black was pretreated as follows:

100 g furnace black (particle size 40 mμ, surface 50 $m^2$/g) was blended for about 15 min. with 40 g polyethylene oxide (molecular weight 1000) and 10 g polyvinyl pyrrolidone (molecular weight 40,000) in 340 g water using a high speed stirrer (10,000 rpm).

The emulsion subsequently was applied onto a polyester support to give, after drying, a silver coating weight of 0.75 g silver per $m^2$. The carbon black coating weight was 0.7 g/$m^2$. Onto this emulsion layer was then applied a cover layer consisting of polyvinyl alcohol (molecular weight 70,000) and 3,3,3',3'-tetramethyl-5,6,5'6'-tetrahydroxy-spiro-bis-indane as the developer material, in such a way that the dried layer contained 0.05 $g/m^2$ of the developer agent.

The material then was exposed through a fine line original (line thickness 8 mμ) using an iodine quartz lamp (1,000 W) at a distance of 60 cm for 10 s. Subsequently, the material was activated for 15 s at 20° C. in a solution of the following composition:

Potassium carbonate (anhydrous): 100 g
Ethylene diamine tetraacetic acid: 1.0 g
Water up to: 1,000 ml Then, the material was washed off for about 15 s by spraying with warm water under pressure. An edge-sharp negative of the original was obtained with a maximum density of 3.2. The resolving power is 120 lines/mm.

EXAMPLE 2

An optically sensitized silver chloride bromide litho-emulsion with a silver chloride content of 70% was produced according to known processes; it contained 85 g gelatin per mole of silver halide and was unhardened. 20 g of a furnace black, pretreated as follows, per mole silver halide were added to this emulsion immediately before casting:

20 g furnace black (particle size 25 mμ/surface 95 $m^2/g$) was blended with 6 g polyethylene oxide (440)-mono-stearyl ether and 8 g 2-methylpentanediol-2,4 in 26 g water, using the procedure described in Example 1.

The emulsion was subsequently applied onto a polyester support in a way that the silver coating weight amounted to 2.0 g silver per $m^2$. Then a gelatin cover layer was applied onto the emulsion layer, whose layer thickness after drying was 0.5 $g/m^2$. The material was exposed behind a halftone original for 5 s using a tungsten lamp (10 Lux) at a distance of 60 cm. Subsequently, it was developed in a tanning developer of the following composition for 30 s at 20° C.:

Potassium carbonate (anhydrous): 100 g
Pyrocatechin: 5.0 g
Potassium bromide: 0.5 g
Ethylene diamine tetraacetic acid: 1.0 g
Water up to 1,000 ml After washing off with warm water (35° C.), a halftone negative of the original with good edge-sharpness and a maximum density of 3.5 is obtained.

EXAMPLE 3

A highly sensitive optically sensitized silver bromide-iodide emulsion, as conventionally used in phototypesetting, was produced according to known methods. The bromide-iodide ratio was 98:2 mole %. The emulsion contained 510 g gelatin per mole silver halide.

Immediately before coating, 100 g furnace black, pretreated as follows, was added to this emulsion:

100 g furnace black was blended with 10 g polyvinyl pyrrolidone (molecular weight 40,000) and 80 g trimethylol propane in 310 g water, as described in Example 1. The emulsion subsequently was applied onto a polyester emulsion support which after drying yielded a silver coating weight of 0.7 g silver per $m^2$.

The emulsion layer then was provided with a gelatin cover layer which after drying contained 1 $g/m^2$ gelatin and 0.1 g 3,3,3',3'-tetramethyl-5,6,5'6'-tetrahydroxy-spiro-bis-indane. The material was exposed in a commercial phototypesetting device, was activated as described in Example 1, and was washed off. Letters and symbols with good edge-sharpness were obtained with a maximum density of 3.5.

EXAMPLE 4

A silver chloride emulsion as described in Example 1 was prepared and divided into parts A, B and C. Immediately before coating, 100 g furnace black (40 mμ, surface 50 $m^2$) were added to part A. Immediately before coating there were added successively to part B:

100 g furnace black (40 mμ, surface 50 $m^2/g$)
40 g polyethylene oxide (molecular weight 1,000)
10 g polyvinyl pyrrolidone (molecular weight 40,000

Immediately before coating, 100 g furnace black (40 mμ, surface 50 $m^2/g$), which was pretreated as described in Example 1, was added to part C.

All three samples were coated as described in Example 1 and were provided with a cover layer described in Example 1. The individual samples were exposed, activated, and washed off during an interval of one day to 6 months, respectively, under the same conditions described in Example 1 and the maximum density of the unexposed and exposed samples was measured. The values obtained are summarized in Table 1.

TABLE 1

| Maximum Density | 1 day | 7 days | 1 mo. | 3 mos. | 6 mos. |
|---|---|---|---|---|---|
| Unexposed | 1.0 | 3.3 | 3.3 | 3.3 | 3.3 |
| Sample A | | | | | |
| Exposed | 3.1 | 3.3 | 3.2 | 3.3 | 3.3 |
| Unexposed | 1.0 | 0.15 | 3.1 | 3.1 | 3.1 |
| Sample B | | | | | |
| Exposed | 3.1 | 3.1 | 3.2 | 3.1 | 3.1 |
| Unexposed | 0.04 | 0.04 | 0.04 | 0.04 | 0.04 |
| Sample C | | | | | |
| Exposed | 3.2 | 3.2 | 3.1 | 3.1 | 3.2 |

As seen from the table, photographic materials which contain a nonpretreated carbon black pigment are not storable because after about 3 days no differentiation is possible between exposed and unexposed areas of the image. Although the storability of photographic materials which contain components used for pretreatment as emulsion additives is somewhat better, however, it is likewise unsatisfactory for practical purposes of application. Good storability is obtained only using a carbon black pretreated according to the present invention.

EXAMPLE 5

Sample A

A material was prepared according to Example 1 of British Pat. No. 1,294,355 with the only difference that a cover layer containing a developer was applied. An unhardened gelatin layer with a dry coating weight of 0.37 $g/m^2$ was applied onto a polyester support. An additional layer was applied onto this underlayer which after drying contained 1.24 g gelatin per $m^2$ and 0.28 g untreated carbon black per $m^2$. (The amount of 02.8 is given in Example 1 of British Pat. No. 1,294,355). Onto this layer was applied subsequently a silver chloride emulsion in a way that the coating weight was 0.88 g silver and 4.6 g gelatin per $m^2$. Finally, a cover layer described in Example 1 was applied in a way that a coating weight of 0.5 g developer agent per $m^2$ results.

Sample B

A material corresponding to Sample A was prepared with the difference that the unhardened gelatin layer between the polyester support and the gelatin-carbon black layer was dispensed with.

Sample C

A material was produced which corresponded to Sample B with the difference that the gelatin concentration in the carbon black-containing layer with the same carbon black content was reduced to a dry coating weight of 0.2 $g/m^2$.

Additionally, the gelatin amount of the light-sensitive layer with the same silver coating weight was reduced from 0.88 g siver per $m^2$ to a dry coating weight of 0.9 g gelatin per $m^2$. The gelatin coating weight of Sample C was altogether 1.1 g per $m^2$ in contrast to 6.2 g per $m^2$ of Sample A.

Sample D

A material corresponding to Sample C was produced with the difference that the same amount of a carbon black pretreated as described in Example 1 was used.

Sample E

A material which was produced as described in Example 1 and which had a silver coating weight of 0.75 g per $m^2$, a carbon black coating weight of 0.7 g per $m^2$ and a gelatin coating weight of 0.6 g per $m^2$ was used as Sample E.

All samples were exposed, activated, and washed off as described in Example 1. Then, the resolving power and minimum and maximum density of the individual samples was measured and summarized in Table 2.

TABLE 2

| Sample | Resolving Power | Minimum Density | Maximum Density |
|---|---|---|---|
| A | [illegible]0 lines/mm | 0.01 | 3.2 |
| B | [illegible]5 lines/mm | 0.05 | 3.2 |
| C | Not measureable | 0.5 | 3.2 |
| D | [illegible]00 lines/mm | 0.01 | 3.2 |
| E | [illegible]20 lines/mm | 0.01 | 3.2 |

The table shows that a material produced according to the British Pat. No. 1,294,355 had a satisfactory minimal density, i.e., it was well washable, however, it had a very poor resolving power (Sample A).

If the unhardened gelatin layer provided between the support and the carbon black-containing layer is dispensed with, then the resolving power is slightly improved; the ability to wash out, however, is considerably deteriorated (Sample B). If the total gelatin content is reduced to improve the resolving power, then a material is obtained which is no longer capable of being washed off and whose resolving power is no longer measurable (Sample C).

If, on the other hand, a pretreated carbon black of the invention is used, then even with low gelatin concentrations a well washable material with an excellent resolving power is obtained (Sample D).

Sample E shows that when using pretreated carbon black the intermediate layer can be completely dispensed with, and the carbon black can be added directly to the light-sensitive layer, without any disadvantage, in high concentrations with a small gelatin content. In this case even better resolving power is obtained.

EXAMPLE 6

Immediately before coating, 120 g furnace black per mole silver chloride, which was pretreated as follows, was added to an unhardened gelatin silver chloride emulsion which contained 107 g gelatin per mole silver chloride:

120 g furnace black (particle size 20 mμ, surface 120 $m^2/g$) was blended to 96 g polyethylene oxide (880)-lauryl ether and 12 g polyvinyl pyrrolidone (molecular weight 70,000) in 252 g water as described in Example 1.

The emulsion was subsequently applied onto a polyester support in a way that after drying a silver coating weight of 0.6 g silver per $m^2$ results. The carbon black coating weight was 0.7 g per $m^2$. Onto the emulsion layer then was applied a cover layer of polyvinyl alcohol (molecular weight 70,000) and chlorohydroquinone in such as way that a dried layer contained 0.2 g developer agent per $m^2$.

The material was subsequently exposed, activated, and washed off as described in Example 1. A negative of the original with good edge-sharpness was obtained, with a maximum density of 3.3 and a resolving power of 105 lines/mm.

EXAMPLE 7

Before coating, 50 g furnace black per mole silver bromide as used in Example 1, which was pretreated as follows, were added to an unhardened, optically sensitized gelatin silver bromide emulsion which contained 160 g gelatin per mole silver bromide:

50 g furnace black was blended with 25 g polyethylene oxide (molecular weight 1,000) and 25 g trimethylolpropane in 150 g water as described in Example 1. The emulsion was subsequently applied to a polyester support in a way that, after drying, a silver coating weight of 1.5 g silver per $m^2$ was formed. The material was subsequently provided with a gelatin cover layer. The dry coating contained 1.0 g gelatin per $m^2$.

Exposure was by means of a tungsten lamp (5 Lux, 3 s, distance 60 cm) behind a fine line original. Then, it was developed for 15 s at 22° C. in a developer of the following composition:

Potassium carbonate (anhydrous): 100 g
Pyrogallol: 5.0 g
Potassium bromide: 1.0 g
Ethylene diamine tetraacetic acid: 1.0 g
Water up to 1,000 ml Development was interrupted in a stop bath (2% acetic acid) and the film was washed off with water of 35° C. A negative of the original with good edge-sharpness was obtained showing an optical density of 3.5 and a resolving power of 100 lines/mm.

EXAMPLE 8

Before coating, 80 g furnace black per mole silver halide, which was pretreated as follows, were added to an unhardened, optically sensitized gelatin silver chloride-bromide emulsion (mole ratio 70:30) which contained 100 g gelatin per mole silver halide:

80 g furnace black was blended with 30 g polyethylene oxide (440)—mono-stearyl ether and 40 g polyethylene oxide (molecular weight 1,000) as described in Example 1. The emulsion then was applied to a polyester support in such a way that, after drying, a silver coating weight of 1.0 g silver per $m^2$ results. Subsequently, a coating layer of gelatin and 2-(1,1-dimethylpropyl)-hydroquinone was applied onto the emulsion layer in a way that the dried layer contained 0.2 g developer agent per $m^2$.

The material was exposed by means of a tungsten lamp (5 Lux, 5 s, distance 60 cm) behind a fine line original, was activated as described in Example 1, and was washed off.

A negative of the original with a good edge-sharpness, a maximum density of 2.9, and a resolving power of 120 lines/mm was obtained.

The best mode of the invention is demonstrated in Example 1.

We claim:

1. In a light-sensitive material for tanning development consisting of a support, an unhardened or only slightly hardened gelatin-containing silver halide emulsion layer and, if desired, an auxiliary layer, wherein at least one layer contains a carbon black participating in forming an image, the improvement comprising employing a carbon black pretreated with at least two water-miscible compounds which have a higher affinity for carbon black than gelatin, said compounds being selected from at least two of the following compound classes, (a) Poly-N-vinyl lactams
(b) Polyalkylene oxide derivatives
(c) Low volatility water-miscible compounds containing at least two OH groups
(d) Polyalkylene oxides with a molecular weight of at least 400.

2. The light-sensitive material of claim 1, characterized in that the total quantity of the compounds use for pretreatment make up at least 50% by wt. of the carbon black amount to be treated.

3. The light-sensitive material of any one of the aforementioned claims, characterized in that the carbon black was pretreated with polyvinyl pyrrolidone and polyethylene oxide with a molecular weight of at least 400.

4. The light-sensitive material of any of claims 1 to 2, characterized in that the carbon black was pretreated with polyethylene oxide stearyl ether and 2-methylpentane diol-2,4.

5. The light-sensitive material of any of the foregoing claims wherein the pretreated carbon black is contained in the silver halide emulsion layer.

6. The light-sensitive material of claim 1 in which the gelatin binder is partially replaced by other natural or synthetic binders.

7. The light-sensitive material of claim 1 in which the binder comprises gelatin and a polymer dispersion of polyacrylate.

8. The light-sensitive material of claim 1 containing poly-hydroxy-spiro-bis-indane compounds.

9. In a light-sensitive wash-off material for tanning development comprising an emulsion support which is coated on one side with an unhardened, or only slightly hardened, gelatino-silver halide emulsion layer, the latter containing carbon black and a tanning developing agent, the improvement wherein (1) the carbon black is one which has been pretreated with at least two compounds selected from at least two of the following compound classes (a) Poly-N-vinyl lactams
(b) Polyalkylene oxide derivatives
(c) Low volatility water-miscible compounds containing at least two OH groups
(d) Polyalkylene oxides with a molecular weight of at least 400, and (2) the emulsion contains a polymer dispersion of polyacrylate and an oxidation-preventive agent.

10. The light-sensitive wash-off material of claim 9 wherein the carbon black which has been pretreated is a furnace black or channel black having a particle size between 20 and 50 mμ.

11. The light-sensitive wash-off material of claim 10 wherein the carbon black is one which has been pretreated with 40 parts by weight of polyethylene oxide (M.W. 1000) and 10 parts by weight of polyvinyl pyrrolidone (M.W. 40,000) per 100 parts by weight of furnace black.

12. A process of producing an image on the light-sensitive wash-off material of any of claims 10–11, consisting essentially of imagewise exposing said material, developing the exposed material in an alkali-activating bath having a pH of at least 9, and thereafter washing off the nonhardened areas with warm water.

* * * * *